United States Patent [19]
Mason et al.
[11] 3,743,943
[45] July 3, 1973

[54] APPARATUS FOR SUPPLYING A TUNING VOLTAGE TO AN ELECTRONICALLY TUNED FM RADIO RECEIVER FROM THE OSCILLATOR OF AN AM RADIO RECEIVER

[75] Inventors: Jerry M. Mason; James L. McKibben, both of Kokomo, Ind.

[73] Assignee: General Motors Corporation, Detroit, Mich.

[22] Filed: Dec. 22, 1971

[21] Appl. No.: 210,865

[52] U.S. Cl. .................. 325/453, 325/316, 325/458, 334/8, 334/11
[51] Int. Cl. .................. H04b 1/16
[58] Field of Search .................. 325/301, 303, 307, 325/416, 315–317, 452, 453, 458, 468, DIG. 1; 334/8, 11, 14, 18, 15; 307/262, 263; 328/140

[56] References Cited

UNITED STATES PATENTS 3,657,654 4/1972 Friberg .................. 325/452

*Primary Examiner*—Benedict V. Safourek
*Assistant Examiner*—Marc E. Bookbinder
*Attorney*—C. R. Meland, Howard N. Conkey et al.

[57] ABSTRACT

The output of a local oscillator of an AM radio receiver tunable from a frequency $f_1$ to a higher frequency $f_2$ is supplied to a pulse generator which generates a pulse having constant width and constant amplitude for each cycle of the output of the AM oscillator. The output of the pulse generator is a series of pulses which is supplied to a first converter which generates a unidirectional signal at its output which is equal to a constant K/2 times the frequency f of the series of pulses. The series of pulses is also supplied to a second converter which generates a signal at its output equal to − K/2 times the frequency $f$ of the series of pulses plus a constant Z. The expression for the magnitude of the potential between the outputs of the first and second converters is $Kf - Z$, where K and Z are determined by the simultaneous solution of the equations $A = Kf_1 - Z$ and $B = Kf_2 - Z$, and A/B is the required tuning voltage ratio required for tuning a voltage tuned FM receiver over the entire FM frequency band.

2 Claims, 1 Drawing Figure

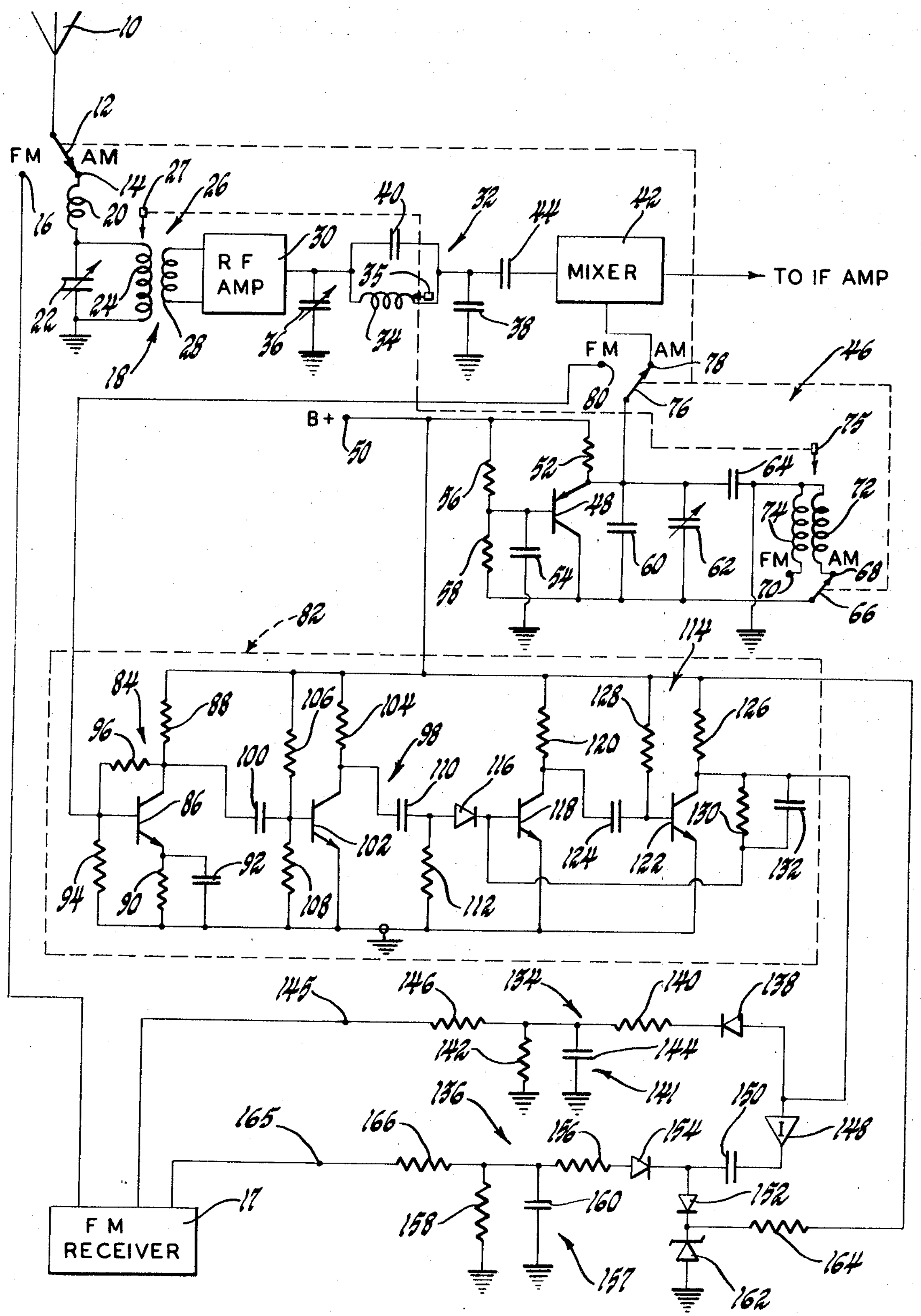
FM
AM
RF AMP
MIXER
TO IF AMP
FM
AM
B+
FM
AM
FM RECEIVER

APPARATUS FOR SUPPLYING A TUNING VOLTAGE TO AN ELECTRONICALLY TUNED FM RADIO RECEIVER FROM THE OSCILLATOR OF AN AM RADIO RECEIVER

This invention relates to a tuning voltage generator for an electronically tuned radio receiver and, more specifically, this invention relates to a circuit for generating a tuning voltage having the required voltage ratio for tuning an electronically tuned radio receiver over its entire frequency band from a local oscillator in a radio receiver operating in another frequency band, the frequency ratio of the local oscillator being different from the tuning voltage ratio.

Conventional radio receivers capable of receiving more than one frequency band, such as the AM and FM frequency bands, require individual tuning elements to effect tuning of each band. For example, in a slug tuned (inductive tuning) receiver, each band requires individual slug tuned coils or, in a voltage tuned receiver, each band requires an individual potentiometer to generate tuning voltages. In those conventional receivers, a slug tuned or voltage tuned circuit in one band cannot be effective for tuning another band. This results principally from the fact that the frequency ratios are significantly different from one band to another which requires different values of inductance or voltage ratios.

It is one object of this invention to provide a circuit for generating a tuning voltage having the required tuning voltage ratio for a voltage tuned radio receiver from the output of the local oscillator of a second radio receiver designed to operate in a second frequency band having a frequency ratio different from the tuning voltage ratio.

It is another object of this invention to provide a circuit for generating a tuning voltage for a voltage tuned FM radio receiver from the local oscillator of an AM radio receiver.

These objects are accomplished by generating a tuning voltage which satisfies the simultaneous solution of the equations $A = Kf_1 - Z$ and $B = Kf_2 - Z$, where A/B is the voltage ratio required to tune the FM radio receiver over its entire frequency band and $f_1/f_2$ is the frequency ratio of the local oscillator of the AM receiver.

The invention may be best understood by reference to the following description of a preferred embodiment and the single figured drawing which is an electrical schematic illustrating the preferred embodiment of this invention.

Referring to the drawing, an antenna 10 for detecting radio frequencies in the AM and FM frequency bands is connected to a switch member 12 having a first position for connecting the antenna to a terminal 14 for an AM reception and a second position which connects the antenna to a terminal 16 for FM reception. When the switch member 12 engages the terminal 16, the signals received by the antenna 10 are coupled to a voltage tuned FM radio receiver 17 for FM reception. When the switch member 12 engages the terminal 14, the signals received by the antenna 10 are coupled to a slug tuned antenna circuit 18 through a noise choke 20. The slug tuned antenna circuit 18 includes the parallel combination of a trimmer capacitor 22 and a tuned primary winding 24 of an antenna coil 26, the parallel circuit being connected between the noise choke 20 and ground. The tuned primary winding is tuned by a tuning slug 27. The received signal at the tuned frequency of the slug tuned antenna circuit 18 is coupled into a secondary winding 28 of the antenna coil 26 and is amplified by an RF amplifier 30. The RF amplifier 30 is of conventional design and consequently will not be described in further detail. The amplified signal at the output of the RF amplifier 30 is supplied to a slug tuned RF band pass-band reject filter 32. The band pass-band reject filter 32 includes a tuned RF coil 34 tuned by a tuning slug 35, a trimmer capacitor 36 and a fixed capacitor 38 which form a series resonant circuit tunable over the frequency band of the AM radio receiver. A band reject capacitor 40 is connected in parallel with the tuned RF coil 34 to form a resonant circuit which blocks the image frequency. The output of the band pass-band reject filter 32 is coupled to a mixer stage 42 through a coupling capacitor 44. The mixer stage is of conventional design and consequently will not be described in greater detail.

The AM receiver also includes a local oscillator 46 which includes a PNP transistor 48 having its emitter connected to a terminal 50 through a resistor 52. The terminal 50 is connected to a source of power B+ (not shown). The base of the transistor 48 is connected to ground through a capacitor 54 and is connected between a resistor 56 and a resistor 58 which are connected in series between the terminal 50 and the collector of the transistor 48. A fixed capacitor 60 and a trimmer capacitor 62 are connected in parallel with one another and with the emitter and collector of the transistor 48. The emitter of the transistor 48 is also connected to ground through a fixed capacitor 64. The collector of the transistor 48 is connected to a switch member 66 which couples the collector of the transistor 48 to a terminal 68 for AM reception and to a terminal 70 for FM reception. A tuned AM oscillator coil 72 is coupled between the terminal 68 and ground. A tuned coil 74 is wound over the slug tuned AM coil 72 and is connected between the terminal 70 and ground. The coils 72 and 74 are tuned by a common tuning slug 75. The output of the oscillator 46, taken at the emitter of the transistor 48, is coupled to a switch member 76 which is positioned to engage a contact 78 for AM reception and positioned to engage a contact 80 for FM reception. The terminal 78 is connected to the mixer stage 42. The switch members 12, 66 and 76 are ganged such that all three are simultaneously switched for AM or FM reception. In addition, the respective tuning slugs 27, 35 and 75 of the tuned primary winding 24 of the antenna coil 26, the tuned RF coil 34 in the tuned RF band pass-band reject filter 32 and the tuned coils 72 and 74 in the oscillator 46 are ganged so as to tune the respective tuned circuits to the proper frequencies in the conventional manner. The operation of the AM radio receiver is standard, the output frequency of the local oscillator 46 supplied to the mixer 42 when the switch member engages the terminal 78 being spaced from the tuned frequencies of the tuned secondary winding 24 and the tuned RF coil 34 by a fixed frequency equal to the desired IF frequency. The output of the mixer 42 is supplied to an IF amplifier (not shown). The remaining portions of the AM radio receiver are not shown as their designs are conventional and are not required for the illustration of the preferred embodiment of this invention.

The slug tuned coil 74 has substantially the same inductance as the slug tuned coil 72 but is wound nonlinearly over the coil 72 so as to give the linear FM frequency vs. tuning dial position during FM reception as will hereinafter be described. If this linearity is provided for within the FM receiver circuitry or is tolerable, the tuned coil 74 could be eliminated as would the switch member 66.

To provide for the tuning of the FM radio receiver 17, the switch members 12, 66 and 76 are positioned to engage the respective terminals 16, 70 and 80. Thereafter, as the tuning slug 75 is moved to tune the local oscillator 46, the frequency of oscillation thereof is determined by the tuned coil 74. As previously indicated, the tuned coil 74 has substantially the same inductance as the coil 72 but is wound nonlinearly. Consequently, the frequency ratio of the output signal of the oscillator 46 supplied to the terminal 80 is substantially the same as the frequency ratio during AM reception. The signal supplied to the terminal 80 is used to generate a tuning voltage for the voltage tuned FM receiver 17.

In order to tune a voltage tuned FM receiver over its entire frequency band, it is necessary to supply thereto a tuning voltage having a low to high voltage ratio of A/B which, for example, may be typically one-eighth. On the other hand, the frequency of the AM local oscillator 46 varies from a lower frequency $f_1$ which may be, for example, 802 KHZ to a higher frequency $f_2$ which may be, for example, 1882 KHZ, the low to high frequency ratio of the oscillator 46 therefore being approximately 1/2.35. Consequently, the direct conversion of frequency-to-voltage to generate a tuning voltage for tuning the FM receiver does not provide the required voltage ratio for tuning the FM receiver over its entire frequency band. To provide for a tuning voltage having the required voltage ratio by using the output signal of the local oscillator 46, a voltage is generated from the output of the local oscillator which is represented by the equation:

$$V = Kf - Z, \quad (1)$$

where V is a tuning voltage which varies between A and B, while $f$ is the frequency of the output signal of the local oscillator which varies between $f_1$ and $f_2$. To determine the magnitudes of the constants K and Z which are necessary in order for V to vary from A to B as f is varied from $f_1$ to $f_2$, the following equations are developed from equation (1) by substituting the end limits of V and $f$:

$$A = Kf_1 - Z, \text{ and} \quad (2)$$

$$B = Kf_2 - Z, \quad (3)$$

the simultaneous solution of which yields the required values of K and Z.

A circuit for implementing equation (1) having the values of K and Z determined by equations (2) and (3) includes a pulse generator 82 which is comprised of an input amplifier 84 including an NPN transistor 86 having its collector connected to the terminal 50 through a resistor 88, its emitter connected to ground through the parallel combination of a resistor 90 and a capacitor 92 and its base connected to ground through a resistor 94. A feedback resistor 96 is connected between the collector and base of the transistor 86. The amplifier 84 receives an input on the base of the transistor 86 from the output of the local oscillator 46 when the switch member 76 is positioned to engage the terminal 80. The amplified signal is supplied to a switch 98 through a coupling capacitor 100.

The switch 98 includes an NPN transistor 102 having its collector connected to the terminal 50 through a resistor 104, its emitter connected to ground and its base connected between a resistor 106 and a resistor 108 which in turn are connected in series between ground and the terminal 50 and to the coupling capacitor 100. The collector of the transistor 104 is also connected to ground through a differentiating capacitor 110 and a resistor 112. Upon each oscillation of the output of the oscillator 46 when the switch member 76 is positioned to engage the terminal 80, the switch 98 supplies a positive pulse to a single shot multivibrator 114 through a diode 116.

The single shot multivibrator 114 is comprised of an NPN transistor 118 having its collector connected to the terminal 50 through a resistor 120, its emitter connected to ground and its base connected to the cathode of the diode 116. The collector of the transistor 118 is also connected to the base of an NPN transistor 122 through a capacitor 124. The transistor 122 has its collector connected to the terminal 50 through a resistor 126, its emitter connected to ground and its base connected to the terminal 50 through a resistor 128. The collector of the transistor 122 is also connected to the base of the transistor 118 through the parallel combination of a feedback resistor 130 and feedback capacitor 132. With each positive pulse supplied to the base of the transistor 118 from the switch 98, the single shot multivibrator 114, supplies at the collector of the transistor 122 a positive pulse having constant amplitude and constant width. This pulse is applied to a converter 134 and a converter 136.

The converter 134 is comprised of a diode 138 having its anode connected to the collector of the transistor 122 of the pulse generator 82 and its cathode connected to ground through the series combination of a resistor 140 and a filter 141 comprised of the parallel combination of a resistor 142 and capacitor 144. Positive pulses are supplied through the diode 138 to the filter 141 from the pulse generator 82. The output $O_1$ of the converter 134 supplied to an output terminal 145 through a resistor 146 is a positive unidirectional voltage having a magnitude related to the frequency of the local oscillator 46, the output $O_1$ being defined by the expression:

$$O_1 = (K/2)f \quad (4)$$

where K/2 is a constant determined by the magnitude of the voltage input B+ to the terminal 50, the width of the pulses at the output of the pulse generator 82 and the circuit parameters of the converter 134. The output $O_1$ of the converter 134 is supplied to the voltage tuned FM receiver.

The converter 136 is comprised of an inverter 148 which receives an input from the pulse generator 82 and whose output is connected to a capacitor 150. The remaining terminal of the capacitor 150 is connected to the anode of a diode 152 and the cathode of a diode 154. The anode of the diode 154 is connected to ground through the series combination of a resistor 156 and a filter 157 comprised of the parallel combination of a resistor 158 and a capacitor 160. The cathode of the diode 152 is connected to the cathode of a Zener diode 162 whose anode is connected to ground. The cathode of the Zener diode 162 is connected to the terminal 50 through a current limiting resistor 164. The negative pulses coupled to the filter 157 when the output of the inverter 148 is grounded to discharge the capacitor 150 causes a negative charge to be developed across the parallel combination of the resistor 158 and the capacitor 160. The output $O_2$ of the converter 136 supplied to an output terminal 165 through a resistor 166 is a negative unidirectional voltage having a magnitude which is defined by the expression:

$$O_2 = -(K/2)f - Z) \tag{5}$$

where K/2 is determined by the same parameters and is identical to K/2 defined with respect to the converter 134 and Z is determined by the positive reference on the capacitor 150 having a magnitude determined by the voltage across the Zener diode 162. The output of the converter 136 is supplied to the voltage tuned FM receiver 17.

The magnitude of the tuning voltage supplied to the voltage tuned FM receiver 17 across the outputs of the frequency-to-voltage converters 134 and 136 is defined by the expression:

$$V = O_1 - O_2 = Kf - Z, \tag{6}$$

which is identical to equation (1). By adjusting the pulse amplitude and width at the output of the pulse generator 82 and circuit parameters of the converters 134 and 136, the required magnitudes of K and Z determined by the simultaneous solution of the equations (2) and (3) are obtained.

Although the function of subtracting Z from K$f$ is shown to be incorporated within the converter 136, such subtraction could be accomplished otherwise such as at the output of the converters 134 and 136 or within the converters 134 and 136.

As the magnitude of K and the magnitude of V were determined by the simultaneous solution of the equations (2) and (3) and as these values were implemented in the pulse generator 82 and the converters 134 and 136, the magnitude of V varies from A to B as the local oscillator 46 is tuned from $f_1$ to $f_2$ to tune the FM receiver 17 over its entire frequency band.

As previously indicated, the tuned coil 74 in the local oscillator 46 was wound nonlinearly so that as the tuning voltage V is varied to tune the FM receiver over its frequency band, the desired frequency vs. dial position is obtained.

Although the preferred embodiment referred to AM and FM frequency bands wherein the FM receiver was tuned from the AM local oscillator, the invention is not limited thereto. The invention applied to the tuning of any receiver from the output of an oscillator whose frequency ratio differs from the required tuning voltage ratio. In addition, the oscillator need not be slug tuned, but may be, for example, voltage tuned.

The detailed description of a preferred embodiment of the invention for the purpose of explaining the principles thereof is not to be considered as limiting or restricting the invention, since many modifications may be made and different circuits may be used to accomplish the same functions by the exercise of skill in the art without departing from the scope of the invention.

We claim:

1. A circuit for supplying a tuning voltage to an electronically tuned FM radio receiver tunable over the FM frequency band in response to a tuning voltage having a low to high voltage ratio A/B comprising, in combination, and AM receiver having an AM local oscillator tunable to a frequency $f$ which varies from a low frequency $f_1$ to a high frequency $f_2$, the ratio $f_1/f_2$ being different from the ratio A/B; circuit means connected to the AM local oscillator, the circuit means including a first converter responsive to the tuned frequency $f$ of the AM local oscillator for generating a signal having a first polarity at a first output terminal, the signal having a magnitude defined by the expression $$K/2\, f, \tag{1}$$

where K is a constant and a second converter responsive to the tuned frequency $f$ of the local oscillator for generating a signal having a second polarity opposite the first polarity at a second output terminal, the signal having a magnitude defined by the expression $$(K/2)\, f - Z \tag{2}$$

where Z is a constant, the magnitude of the potential between the first and second output terminals being defined by the expression $$Kf - Z, \tag{3}$$

the magnitudes of K and Z being determined by the equations $$A = Kf_1 - Z \tag{4}$$

and $$B = Kf_2 - Z; \tag{5}$$

and means connected to the first and second output terminals for supplying the potential therebetween to the electronically tuned FM radio receiver to effect tuning thereof, whereby the potential between the first and second output terminals varies from A to B as the AM local oscillator is tuned from $f_1$ to $f_2$.

2. In combination: an FM radio receiver tunable over the FM frequency band in response to the magnitude of a tuning voltage V having a low-to-high magnitude ratio A/B; an AM receiver including an AM local oscillator having a frequency $f$ which varies from a low frequency $f_1$ to a high frequency $f_2$ as the AM radio receiver is tuned across the AM band thereby to provide a low-to-high frequency ratio $f_1/f_2$ different from the ratio A/B; pulse generator connected to the AM local oscillator for generating constant amplitude and constant width tuning pulses having the frequency $f$; a first converter connected to the pulse generator for generating a positive signal $O_1$ at a first output terminal, the signal being defined by the expression $$O_1 = (K/2) f \tag{1}$$

where K is a constant; a second converter connected to the pulse generator for generating a negative signal $O_2$ at a second output terminal, the signal being defined by the expression $$O_2 = -((K/2) f - Z) \tag{2}$$

where Z is a constant, the potential between the first and second output terminals being the tuning voltage V defined by the expression $$V = O_1 - O_2 \tag{3}$$

so that $$V = Kf - Z, \tag{4}$$

where the magnitudes of K and Z are determined by the equations $$A = Kf_1 - Z \tag{5}$$

and $$B = Kf_2 - Z; \tag{6}$$

and means connected to the first and second output terminals for applying the tuning voltage V to tune the FM radio receiver such that the magnitude of the tuning voltage V varies from A to B as the AM local oscillator is tuned from $f_1$ to $f_2$.

* * * * *

PO-1050
(5/69)

UNITED STATES PATENT OFFICE
CERTIFICATE OF CORRECTION

Patent No. 3,743,943 Dated July 3, 1973

Inventor(s) Jerry M. Mason and James L. McKibben

It is certified that error appears in the above-identified patent and that said Letters Patent are hereby corrected as shown below:

Column 4, line 43, after "and" insert -- a --;

Column 5, line 15, the formula "$O_2 = -(K/2)f - Z)$" should read -- $O_2 = -((K/2)f - Z)$ --;

Column 5, line 60, "applied" should read -- applies --;

Column 6, line 20, the formula "K/2f," should read -- (K/2)f, --; and,

Column 6, line 64, before "pulse" insert -- a --.

Signed and sealed this 5th day of March 1974.

(SEAL)
Attest:

EDWARD M.FLETCHER,JR.
Attesting Officer

C. MARSHALL DANN
Commissioner of Patents